United States Patent
Scanlan et al.

(10) Patent No.: US 6,855,209 B2
(45) Date of Patent: Feb. 15, 2005

(54) PLASMA CHAMBER CLEANING

(75) Inventors: John Scanlan, Waterford (IE); Kevin O'Leary, Lucan (IE)

(73) Assignee: Scientific Systems Research Limited, Dublin (IE)

( * ) Notice: Subject to any disclaimer, the term of this patent is extended or adjusted under 35 U.S.C. 154(b) by 467 days.

(21) Appl. No.: 10/133,081

(22) Filed: Apr. 26, 2002

(65) Prior Publication Data

US 2003/0159715 A1 Aug. 28, 2003

(30) Foreign Application Priority Data

Feb. 22, 2002 (IE) .......................................... 2002/0142

(51) Int. Cl.⁷ ................................................ B08B 7/04
(52) U.S. Cl. ......................... 134/18; 134/1.1; 134/22.1; 134/902; 438/905

(58) Field of Search ........................... 134/1.1, 18, 22.1, 134/902; 438/905

(56) References Cited

U.S. PATENT DOCUMENTS

| | | |
|---|---|---|
| 5,458,732 A | 10/1995 | Butler et al. |
| 6,051,284 A | 4/2000 | Byrne et al. |
| 6,305,390 B1 | 10/2001 | Jeon |
| 6,503,410 B1 | 1/2003 | Blalock et al. |
| 6,564,810 B1 | 5/2003 | Raaijmakers et al. |
| 2001/0008138 A1 | 7/2001 | Demos et al. |

Primary Examiner—M. Kornakov
(74) Attorney, Agent, or Firm—Alston & Bird LLP

(57) ABSTRACT

A method for determining optimum plasma chamber cleaning cycles based on an electrical precursor signal. Polymer build up on the interior wall of plasma chamber 1 during normal production runs is monitored by observing the phase of the fundamental RF signal on a pre-selected baseline process. At a predetermined level of this signal, the chamber processing is stopped and the chamber walls are cleaned.

8 Claims, 2 Drawing Sheets

PLASMA CHAMBER CLEANING

BACKGROUND OF THE INVENTION

1. Field of the Invention

The present invention relates to a method of determining the wet-cleaning interval for the interior walls of an RF-powered plasma processing chamber subject to unwanted material build-up.

2. Prior Art

Many thin film processes use plasma processes to facilitate the rapid and accurate fabrication of minute structures with desired properties. Plasma processes include the deposition and etching of insulators, conductors and semiconductors on a substrate, for example, a silicon wafer. The plasma process usually involves placing the substrate in a vacuum chamber, introducing process gases and applying radio-frequency (RF) power, typically 0.1 to 200 MHz, to create a plasma. The plasma consists of ions, electrons, radical gas species and neutral gas, all of which permit the desired reaction to proceed. The plasma reaction has many inputs, including RF power, gas type and flow rates, chamber pressure, substrate and wall temperatures, chamber wall conditions, electrode spacing, and so on.

The chamber configuration and chemistry used is chosen according to the desired process. For example, plasmas are used to etch dielectrics in semiconductor manufacture using specific plasma chamber designs such as Reactive Ion Etching (RIE) or Inductively Coupled Plasma (ICP) and using etching gases such as $CHF_3$, $CF_4$, $O_2$ and so on.

In the etching of dielectric films, various by-products are created which may or may not be removed by the chamber pumping apparatus. By-products (including various polymers) which are not removed may be deposited as a series of layers on the walls of the reactor. The layers degrade over time, and eventually start to crack and flake, resulting in particle deposition on the wafer surface and decreased yield.

In the ideal production scenario, the plasma chamber operates continually, only stopping for scheduled maintenance. This maintenance often includes chamber cleaning using wet chemicals to remove the layers deposited on the chamber walls by the plasma process. This process is time consuming and can involve tool downtimes of several hours. If this wet-clean is performed too frequently, production uptime is negatively impacted and production costs are increased. On the other hand, if the deposited layer is not removed in a timely fashion, then product yield is negatively impacted by polymer flaking from the reactor walls.

Wet cleans can be scheduled according to a number of criteria. One method is to perform a wet clean after a given number of wafers are processed. A second is to use a measure of the time that RF power has been switched on in the chamber. A problem with these methods is that many production facilities manufacture different products with different process recipes or chemistries employed on each one. In this case, the relationship between wafer count or RF on-time and the incidence of flaking is not straightforward. Thus, wet-clean optimisation on wafer count or RF on-time is difficult. A third method is to use some sort of monitor for flaking events. One such method uses a particle measurement wafer to monitor for these flaking events. If particles are seen to increase dramatically then the chamber is taken down for a wet-clean. The particle measurement wafer will normally be run on a daily basis, so that yield loss of one day's production is possible. It would be far more advantageous to have a system that pre-empts the flaking event rather than observes the flaking event.

It is known that certain electrical signals derived from the plasma power source can be sensitive to many plasma processing events. The plasma represents a non-linear complex load in electrical terms. This results in the generation of harmonics of the RF driving signal. These harmonics, known as Fourier components, are very sensitive to changes both in the plasma process and the process parameters. It is generally accepted that monitoring the Fourier components of the RF power signal provides a useful way to monitor the plasma process. These components are a more direct measurement of the plasma process since they are more directly related to fundamental plasma parameters.

It is known to use an RF sensor to monitor and control RF plasmas by measuring the Fourier components of voltage and current. The sensor can be used in closed or open loop control, as for example, in etch end-point control or as in-situ monitoring of the plasma process. In either case the plasma can be terminated when one or more of the RF Fourier components reaches pre-determined limits.

U.S. Pat. No. 5,458,732 describes a method of determining the condition of a plasma-processing chamber by monitoring an RF signal at a frequency other than the fundamental frequency. For example, if the chamber wall conditions change, then signals in the harmonics of the RF applied signal can detect that change. The limitation of this approach is that the event is detected after it has occurred. It would be far more useful for the operators of plasma-processing chambers to have a precursor system for pre-empting flaking events. Another limitation of this technique as applied to chamber clean optimisation is that the harmonics are sensitive to many events on the plasma chamber and are also subject to gross changes following standard preventative maintenance. This means that the parameters of any control algorithm need constant updating. Changes in the process inputs will also change harmonics. Furthermore, harmonics vary widely from chamber to chamber, even for the same chamber type, so that any prediction algorithm is chamber dependent. Also, changes in substrate type, even the thickness of underlying layers, will change the harmonic signal.

There is a need, therefore, for an improved method of determining the wet-cleaning interval for the interior walls of an RF-powered plasma processing chamber, which allows the optimisation of chamber wet-clean cycles.

SUMMARY OF THE INVENTION

Accordingly, the present invention provides a method of determining the cleaning interval for the interior walls of an RF-powered plasma processing chamber subject to unwanted material build-up, the method comprising:

(a) after cleaning the walls, running a given baseline plasma process on the chamber and determining the corresponding magnitude of a characteristic of the delivered RF power at the fundamental frequency, (b) repeating step (a) at intervals between production runs, and (c) cleaning the walls at a time which is a function of the said magnitude.

In the present specification a baseline plasma process is a plasma process with pre-determined values for the process input parameters. It is therefore a datum from which inferences regarding the plasma process may be drawn.

This invention provides several advantages over the existing known methods. Firstly, the chamber cleaning cycle can be optimised because a precursor signal to the flaking event is provided rather than a monitor of the flaking event itself. Therefore the flaking event can be avoided completely.

Another advantage is the use of a component of the RF at the fundamental frequency rather than at a harmonic. This has the advantage of being robust and relatively insensitive to changes in process inputs. For example, changes in the match unit tuning or small changes in power, pressure, etc., will not particularly influence the fundamental component, whereas the harmonic components are greatly affected. Harmonics are also very sensitive to hardware components so that chamber to chamber harmonics can be greatly different.

Yet another advantage is that rather than monitoring on product wafers, running production processes, monitoring is done on a known baseline. This has the advantage that input changes which adversely influence the measurement are avoided.

BRIEF DESCRIPTION OF THE DRAWINGS

An embodiment of the invention will now be described, by way of example, with reference to the accompanying drawings, wherein.

DETAILED DESCRIPTION OF A PREFERRED EMBODIMENT

Figure 1:
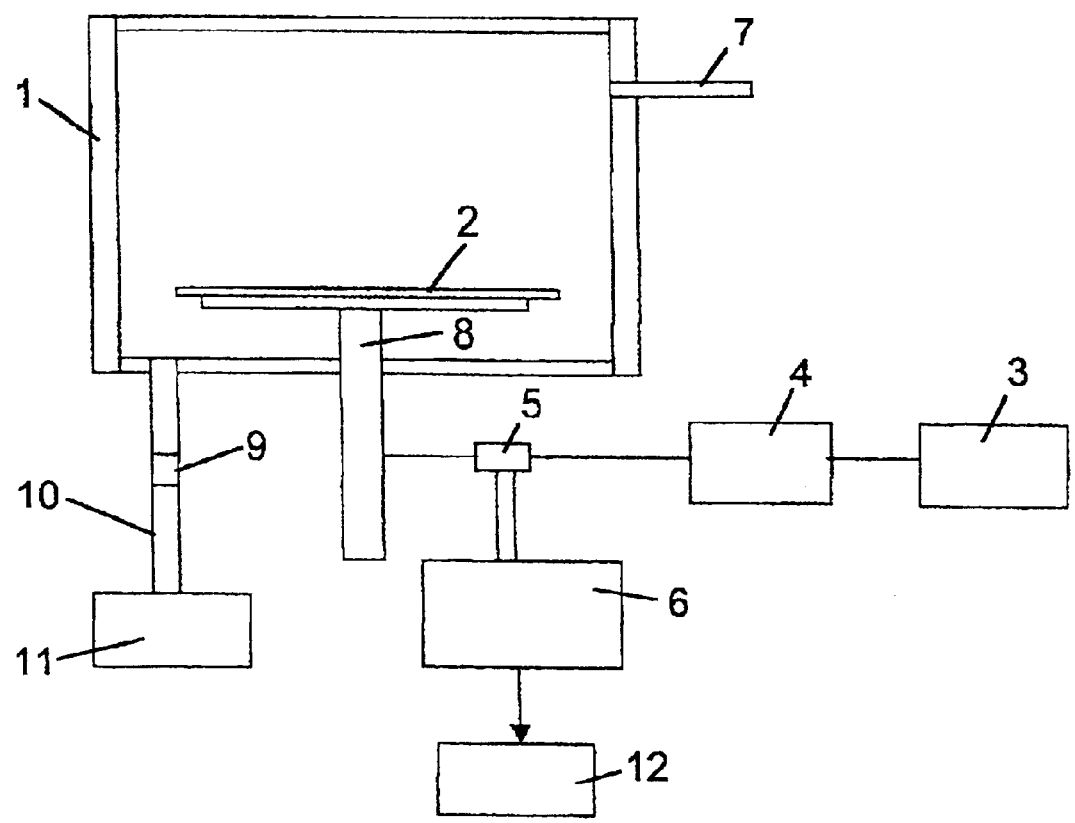
FIG. 1 depicts a typical plasma process chamber.

FIG. 1 shows a typical plasma process reactor. It includes a plasma chamber 1 containing a wafer or substrate 2 to be processed. A plasma is established and maintained within the chamber by an RF power source 3. This source generally has real impedance which must undergo a transformation to match that of the complex plasma load. This is done via match network 4. Power is coupled to the plasma chamber, typically by capacitive coupling, through an electrode 8. However, the invention also applies to systems that have more than one capacitive electrode, those that are inductively coupled or transformer coupled, helical/helicon wave systems and electron-cyclotron resonance systems. Process gases are admitted through gas inlet 7 and the chamber is maintained at a desired process pressure by removing process gases and by-products through gas exhaust line 10 using pump 11. A throttle valve 9 may be used to control process pressure in an automatic control loop.

The wafer is processed according to some recipe, which is controlled by the chamber operator. This recipe includes input parameter settings such as process gas types and flow rates, chamber pressure, substrate/wall temperatures, RF power settings on one or more power generators, recipe time, inter-electrode spacing, etc. This is the case for all plasma processing tools, such as etch, deposition, etc. The wafer will undergo very many plasma process steps before completion. Each step contributes to the overall product yield; a fault at any one step may destroy potential product.

Referring again to FIG. 1, an RF sensor 5 is used to measure the voltage and current of the RF electrical power signal in the complex post-match electrical line. A Fourier Transform is performed in data collection electronics 6 using a sampling technique which extracts the Fourier components of the voltage and current and the phase angle between these vectors. This data sampling should have sufficiently high resolution to determine Fourier components (in this embodiment the first five including the fundamental) across a very large dynamic range (90 dB) with phase resolution of up to 0.001 degree. Suitable techniques for high resolution sampling and measurement of Fourier components are described in U.S. Pat. No. 5,808,415.

The output of the data collection electronics 6 is connected to a controller 12 which may be a computer or other system which uses the signals to yield information about and/or control the plasma process.

In an embodiment of the inventive method the controller 12 uses a simple algorithm for predicting when a wet clean of the interior chamber walls should be carried out. In the embodiment it is assumed that the chamber 1 is used to perform daily production runs in which silicon dioxide is selectively etched from silicon wafers using polymer-forming chemistry, a process which leads to polymer build-up on the interior chamber walls.

The method starts by running a baseline process on the chamber immediately after a wet clean of the interior chamber walls. In this embodiment, i.e. where the chamber is used for oxide etching with attendant polymer build-up on the walls, the baseline process uses a polysilicon test wafer and a helium gas plasma running at process pressure of 100 mT and process power of 400 W. Then, the same baseline process is run each day after the production run(s) for that day. For each run of the baseline process the phase of the fundamental of the RF power signal, as detected by the sensor 5, is determined. When a predetermined threshold level for the phase is reached, production wafer processing in the chamber is stopped and the chamber is wet cleaned.

Figure 2:
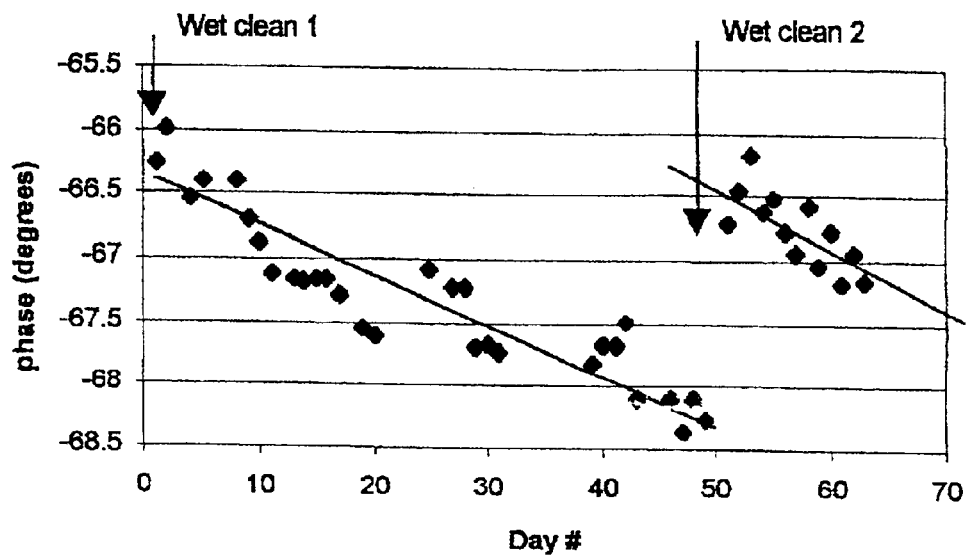
FIG. 2 shows baseline RF phase at the fundamental as a function of days of production run across two chamber wet-clean cycles on a dielectric etch chamber.

The validity of the method is illustrated by the test data shown in FIG. 2, which, like the embodiment, relates to a plasma chamber performing an oxide etch on a polysilicon wafer. A baseline process was ran immediately after a wet clean (Wet clean 1) and then periodically during one complete preventive maintenance (PM) cycle. The chamber was then wet-cleaned again (Wet clean 2), and the baseline process run periodically for part of the next PM cycle.

FIG. 2 shows the variation in phase angle of the fundamental component of the RF signal, in this case 2 MHz. There is a clear trend in the data showing a strong correlation between the phase angle and the time elapsed since the wet clean.

The change in phase is due to the build-up of polymer layers in the process chamber which changes the chamber impedance and therefore the phase angle. A linear model for the relationship between the two parameters has a statistical correlation $R^2$ value of 0.85, indicating a good fit. After the second wet clean, the baseline process was repeated for part of the next PM cycle, and displays a very similar trend. It can be seen that the phase of the fundamental of the RF signal is a useful predictor of the amount of build-up on the chamber walls, and hence also predicts when the chamber should be wet-cleaned.

The threshold level at which cleaning is carried out is set empirically by choosing a value of phase that corresponds to maximum chamber lifetime and minimal flaking from the chamber walls. A simple algorithm is used by the controller 12 to compare each new phase angle measurement to the threshold level. Once the threshold level is reached, the operator of the chamber is alerted to stop processing and commence a wet-clean.

Figure 3:
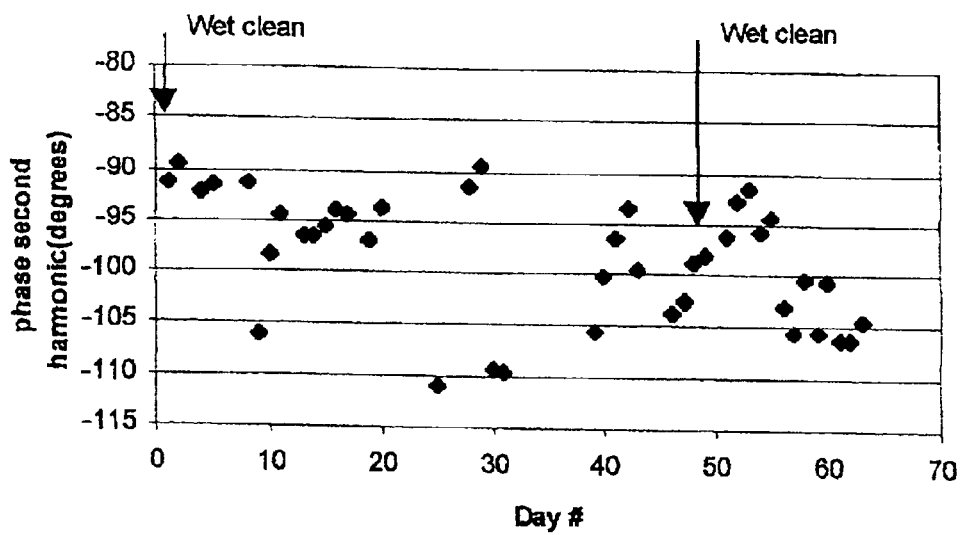
FIG. 3 shows baseline RF phase at the second harmonic over the same period and for the same chamber.

For the sake of comparison, FIG. 3 shows the variation in phase angle of the second harmonic. In this case there is a very poor correlation between this signal and time elapsed since the wet clean. Therefore, this harmonic signal is not a useful predictor of plasma chamber lifetime.

As an alternative to performing a daily baseline process right up until the phase reaches the threshold level at which the next wet clean should be performed, it is possible to stop baseline processing once enough data has been obtained to establish the trend line of the data. The trend line is the solid sloped line shown in FIG. 2 and is linear. By day 30 (depending on the particular production and baseline processes used) it is likely that enough data will have been obtained to establish the trend line with sufficient certainty to obviate the need for further runs of the baseline process. Then, the chamber is wet cleaned on the day on which the trend line crosses the threshold level.

The present invention, although described for a semiconductor oxide etch process, can be applied to any plasma process, including the fabrication of flat panel displays, optical components, memory devices and any other process utilising plasma. The baseline process is chosen for the particular production process and will generally be a simplified version of it. For example, rather than multiple steps a single step is sufficient. Also, similar plasma power and pressure to a standard production recipe can be used. Preferably the baseline process uses a gas plasma which is inert to (i.e. does not etch) the built-up material on the interior chamber walls which is being monitored for wet cleaning. The baseline process does not necessarily need to use a test wafer, and it can be run without a wafer or other substrate. Also, a different characteristic of the RF power signal at the fundamental frequency could be measured; for example, current or voltage rather than phase.

The invention is not limited to the embodiments described herein which may be modified or varied without departing from the scope of the invention.

What is claimed is:

1. A method of motivating flaking events by determining a cleaning interval for interior walls of an RF-powered plasma processing chamber subject to unwanted material-build-up, the method comprising:

(a) after cleaning the walls, running a given baseline plasma process on the chamber and determining a corresponding magnitude of a characteristic of delivered RF power at a fundamental frequency;

(b) repeating step (a) at intervals between production runs; and (c) cleaning the walls at a time which is a function of the said magnitude.

2. A method as claimed in claim 1, wherein the walls are cleaned when the said magnitude reaches a predetermined threshold level.

3. A method as claimed in claim 1, further including establishing a trend line for changes in the said magnitude over time, the walls being cleaned at a time indicated by the trend line crossing a predetermined threshold level.

4. A method as claimed in claim 1, wherein the baseline process uses a gas plasma inert to the unwanted material.

5. A method as claimed in claim 1, wherein the unwanted material comprises a polymer resulting from use of the plasma chamber during the said production runs as an etch chamber using polymer-forming chemistry.

6. A method as claimed in claim 1, wherein the characteristic of the delivered RF power at a fundamental frequency is the phase.

7. A method as claimed in claim 1, wherein the baseline process is carried out on a test substrate.

8. A method as claimed in claim 1, wherein the baseline process is run in the absence of a substrate.

* * * * *

UNITED STATES PATENT AND TRADEMARK OFFICE
CERTIFICATE OF CORRECTION

PATENT NO. : 6,855,209 B2
APPLICATION NO. : 10/133081
DATED : February 15, 2005
INVENTOR(S) : Scanlan et al.

It is certified that error appears in the above-identified patent and that said Letters Patent is hereby corrected as shown below:

Column 6,
Line 2, "motivating" should read --mitigating--.

Signed and Sealed this

Fifth Day of June, 2007

JON W. DUDAS
*Director of the United States Patent and Trademark Office*